United States Patent
Maity et al.

(10) Patent No.: US 7,586,602 B2
(45) Date of Patent: Sep. 8, 2009

(54) METHOD AND APPARATUS FOR IMPROVED SIGNAL TO NOISE RATIO IN RAMAN SIGNAL DETECTION FOR MEMS BASED SPECTROMETERS

(75) Inventors: Sandip Maity, Bangalore Karnataka (IN); Ayan Banerjee, Bangalore (IN); Anis Zribi, Rexford, NY (US); Stacey Kennerly, Niskayuna, NY (US); Long Que, Rexford, NY (US); Glenn Claydon, Wynantskill, NY (US); Shankar Chandrasekaran, Tamil Nadu (IN); Shivappa Goravar, Laxmeshwar Karnataka (IN)

(73) Assignee: General Electric Company, Niskayuna, NY (US)

( * ) Notice: Subject to any disclaimer, the term of this patent is extended or adjusted under 35 U.S.C. 154(b) by 147 days.

(21) Appl. No.: 11/459,449

(22) Filed: Jul. 24, 2006

(65) Prior Publication Data
US 2008/0018890 A1    Jan. 24, 2008

(51) Int. Cl.
*G01J 3/44* (2006.01)
(52) U.S. Cl. ...................................... 356/301
(58) Field of Classification Search .................. 356/301
See application file for complete search history.

(56) References Cited

U.S. PATENT DOCUMENTS

| | | | |
|---|---|---|---|
| 4,399,564 A | 8/1983 | Cowen | |
| 6,188,473 B1 | 2/2001 | Leistner et al. | |
| 6,342,701 B1 | 1/2002 | Kash | |
| 6,609,015 B2 | 8/2003 | Lucassen et al. | |
| 6,674,065 B2 | 1/2004 | Atia et al. | |
| 6,836,597 B2 | 12/2004 | Chan | |
| 6,858,912 B2 | 2/2005 | Marshall et al. | |
| 2002/0072015 A1 | 6/2002 | Miller et al. | |
| 2002/0091324 A1 | 7/2002 | Kollias et al. | |
| 2002/0104990 A1 | 8/2002 | DeReus et al. | |
| 2002/0168136 A1 | 11/2002 | Atia et al. | |
| 2002/0181849 A1 | 12/2002 | Flanders | |
| 2003/0071216 A1 | 4/2003 | Rabolt et al. | |

(Continued)

FOREIGN PATENT DOCUMENTS

EP    0510629 A1    10/1992

(Continued)

OTHER PUBLICATIONS

Brochure for Technical Information SD-28—Characteristics and use of Si APD (Avalanche Photodiode), Information furnished by Hamamatsu, May 2004 DN, 12 pages.

(Continued)

*Primary Examiner*—Kara E Geisel
(74) *Attorney, Agent, or Firm*—Joseph J. Christian

(57) ABSTRACT

A method of Raman detection for a portable, integrated spectrometer instrument includes directing Raman scattered photons by a sample to an avalanche photodiode (APD), the APD configured to generate an output signal responsive to the intensity of the Raman scattered photons incident thereon. The output signal of the APD is amplified and passed through a discriminator so as to reject at least one or more of amplifier noise and dark noise. A number of discrete output pulses within a set operational range of the discriminator is counted so as to determine a number of photons detected by the APD.

8 Claims, 4 Drawing Sheets

U.S. PATENT DOCUMENTS

| | | |
|---|---|---|
| 2003/0085196 A1 | 5/2003 | Coppeta |
| 2003/0108306 A1 | 6/2003 | Whitney et al. |
| 2003/0139687 A1 | 7/2003 | Abreu |
| 2003/0161374 A1 | 8/2003 | Lokai |
| 2004/0169854 A1* | 9/2004 | Vo-Dinh et al. ............. 356/301 |
| 2005/0168735 A1* | 8/2005 | Boppart et al. ............. 356/301 |
| 2005/0248759 A1* | 11/2005 | Wang et al. ................. 356/301 |
| 2005/0253132 A1 | 11/2005 | Marshall et al. |
| 2005/0256650 A1 | 11/2005 | Labarbe et al. |
| 2005/0258340 A1 | 11/2005 | Glasper et al. |
| 2007/0091305 A1* | 4/2007 | Xie et al. .................... 356/301 |

FOREIGN PATENT DOCUMENTS

| | | |
|---|---|---|
| EP | 1236807 A2 | 9/2002 |
| JP | 62223636 A | 1/1987 |
| WO | WO0161291 A1 | 8/2001 |
| WO | WO2004079351 A1 | 9/2004 |
| WO | WO 2005/124322 | * 12/2005 |

OTHER PUBLICATIONS

Characterization of Geiger Mode Avalanche Photodiodes for Fluorescence Decay Measurements; J.C. Jackson, et al.; Paper Reference: Proceedings of SPIE, vol. 4650-07, Photonics West, San Jose, CA, Jan. 19-25, 2002; 12 pages.

PCT International Search Report dated Nov. 10, 2008.

* cited by examiner

METHOD AND APPARATUS FOR IMPROVED SIGNAL TO NOISE RATIO IN RAMAN SIGNAL DETECTION FOR MEMS BASED SPECTROMETERS

BACKGROUND OF THE INVENTION

The invention relates generally to spectroscopy systems and, more particularly, to a method and apparatus for improved signal-to-noise ratio in Raman signal detection for micro electromechanical system (MEMS) based spectrometer devices.

Spectroscopy generally refers to the process of measuring energy or intensity as a function of wavelength in a beam of light or radiation. More specifically, spectroscopy uses the absorption, emission, or scattering of electromagnetic radiation by atoms, molecules or ions to qualitatively and quantitatively study physical properties and processes of matter. Raman spectroscopy relies on the inelastic scattering of intense, monochromatic light, typically from a laser source operating in the visible, near infrared, or ultraviolet range. Photons of the monochromatic source excite molecules in the sample upon inelastic interaction, resulting in the energy of the laser photons being shifted up or down. The shift in energy yields information about the molecular vibration modes in the system/sample.

However, Raman scattering is a comparatively weak effect in comparison to Rayleigh (elastic) scattering in which energy is not exchanged. Depending on the particular molecular composition of a sample, only about one scattered photon in $10^6$ to about $10^8$ tends to be Raman shifted. Because Raman scattering is such a comparatively weak phenomenon, an instrument used to analyze the Raman signal should be able to substantially reject Rayleigh scattering, have a high signal to noise ratio, and have high immunity to ambient light. Otherwise, a Raman shift may not be measurable.

A challenge in implementing Raman spectroscopy is separating the weak inelastically scattered light from the intense Rayleigh-scattered laser light. Conventional Raman spectrometers typically use reflective or absorptive filters, as well as holographic diffraction gratings and multiple dispersion stages, to achieve a high degree of laser rejection. A photon-counting photomultiplier tube (PMT) or a charge coupled device (CCD) camera is typically used to detect the Raman scattered light.

Concurrently, however, there is a growing need for miniaturization of instruments for biological, chemical and gas sensing in applications that vary from medical to pharmaceutical to industrial to security. This is creating a paradigm shift in experimentation and measurement, where the trend is to bring the instrument/lab to the sample rather than bringing the sample back to the lab for analysis. Unfortunately, conventional methods of Raman detection that also provide sufficient signal-to-noise ratio (e.g., PMTs, CCD cameras) are generally not compatible with MEMS scaled devices, due to the bulk associated therewith. Accordingly, it is desirable to be able to detect Raman scattering with a higher signal-to-noise ratio given the constraints of smaller, on-chip "in the field" spectrometer devices.

BRIEF DESCRIPTION OF THE INVENTION

The above and other drawbacks and deficiencies of the prior art may be overcome or alleviated by an embodiment of a method of Raman detection for a portable, integrated spectrometer instrument, including directing Raman scattered photons by a sample to an avalanche photodiode (APD), the APD configured to generate an output signal responsive to the intensity of the Raman scattered photons incident thereon. The output signal of the APD is amplified and passed through a discriminator so as to reject at least one or more of amplifier noise and dark noise. A number of discrete output pulses within a set operational range of the discriminator is counted so as to determine a number of photons detected by the APD.

In another embodiment, an apparatus for Raman detection within a portable, integrated spectrometer instrument includes an avalanche photodiode (APD) integrated on a chip, the APD configured to receive Raman scattered photons by a sample and generate an output signal responsive to the intensity of the Raman scattered photons incident thereon. An amplifier is integrated on the chip, the amplifier configured to amplify the output signal of the APD and pass the amplified output signal through a discriminator integrated on the chip so as to reject at least one or more of amplifier noise and dark noise. A digitizer is integrated on the chip, and configured to count a number of discrete output pulses within a set operational range of the discriminator so as to determine a number of photons detected by the APD.

In another embodiment, a method of Raman detection for a portable, integrated spectrometer instrument includes directing an input optical beam incident upon a sample to be measured, the input optical beam modulated at a heterodyne frequency. Photons scattered by the sample are directed through receiving optics so as to filter Rayleigh scattered photons and pass Raman scattered photons through a tunable filter, and the passed Raman scattered photons are detected at a wavelength passed by the tunable filter through demodulation at the heterodyne frequency.

In still another embodiment, an apparatus for Raman detection within a portable, integrated spectrometer instrument includes an optical source for directing an input optical beam incident upon a sample to be measured. A beam-interrupting mechanism is configured to modulate the input optical beam at a heterodyne frequency, and receiving optics are configured to collect photons scattered by the sample so as to filter Rayleigh scattered photons and pass Raman scattered photons through a tunable filter. A photon detector is configured to detect the passed Raman scattered photons at a wavelength passed by the tunable filter through demodulation at a heterodyne frequency.

These and other advantages and features will be more readily understood from the following detailed description of preferred embodiments of the invention that is provided in connection with the accompanying drawings.

DETAILED DESCRIPTION OF THE INVENTION

Embodiments of the invention disclosed herein include a method for implementing high signal-to-noise ratio (SNR) in Raman signal detection for micro electromechanical (MEMS) based spectrometer devices, characterized generally in one aspect by photon detection through a cooled avalanche photodiode used in conjunction with photon counting. Other embodiments include chopping of the incident optical beam for heterodyne detection by modulating the source with a reference frequency and then extracting the signal by demodulating the output at the reference frequency. Chopping may be implemented, in one embodiment, through an acousto-optic modulator (AOM) crystal for diffracting and shifting the incident beam away from the sample at the heterodyne modulation frequency, or through an MEMS cantilever that deflects to/from the path of the input beam at the modulation frequency. Still other embodiments include a combination of heterodyne detection and photon counting for even further SNR improvement.

Figure 1:
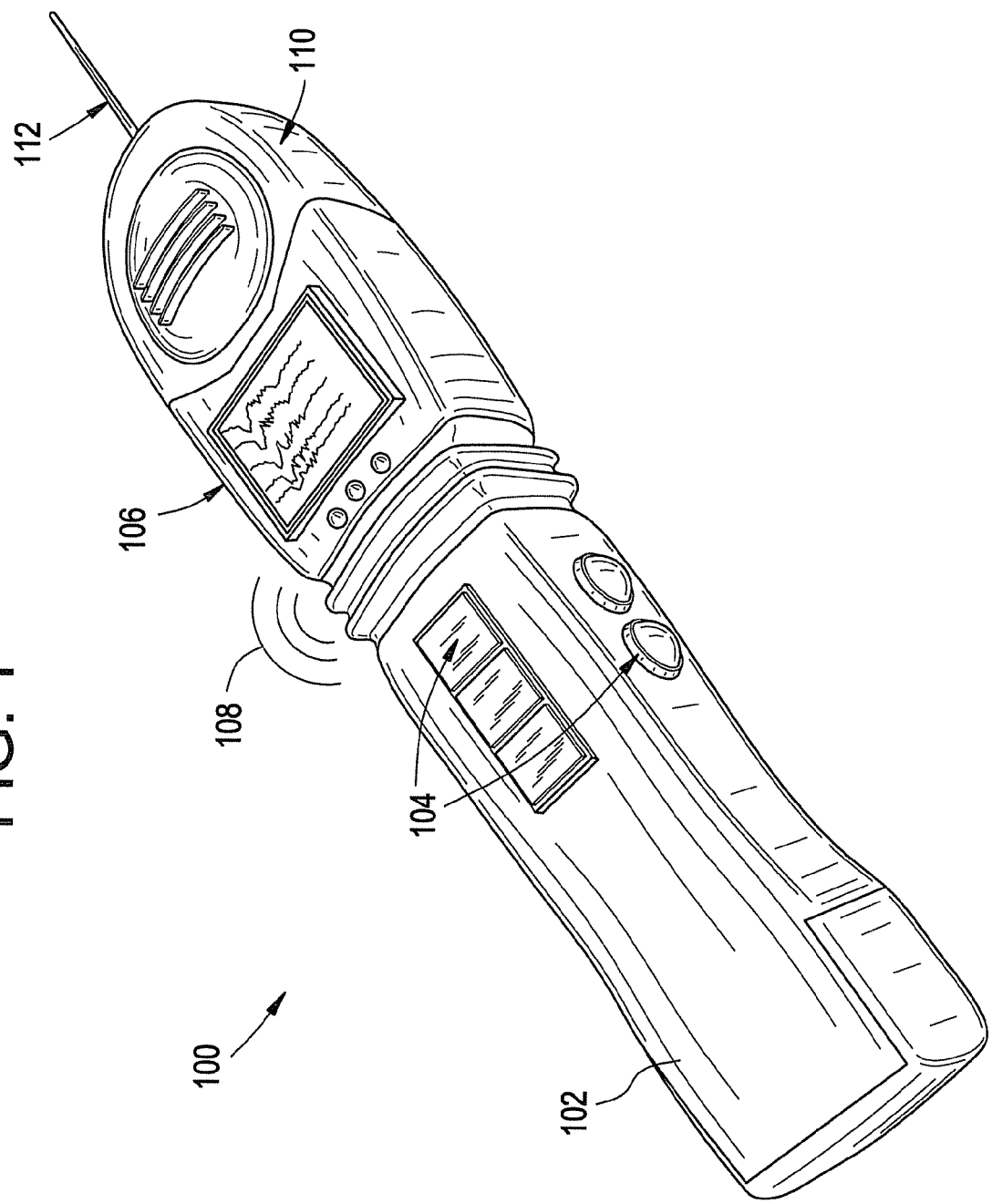
FIG. 1 is a perspective view of an exemplary portable, hand-held Raman spectrometer device, suitable for use in accordance with an embodiment of the invention.

Referring initially to FIG. 1, there is shown a perspective view of a compact, hand-held spectrometer device 100 suitable for use in accordance with an embodiment of the invention. It should be understood that the hand-held spectrometer device 100 illustrates only an exemplary application/environment for the inventive embodiments discussed herein and is intended to demonstrate disclosed improvements in detecting Raman scattering (through higher signal-to-noise ratio), given the constraints of smaller, on-chip "in the field" spectrometer devices such as the exemplary device shown in FIG. 1.

For the exemplary device 100 depicted, a hand-held body 102 includes large, user-friendly operator controls 104, a display portion 106 with an optional audio alarm feature 108, and an optional, disposable optofluidics module 110 having a fluid inlet 112 for collecting and analyzing a fluid sample. Although not specifically illustrated in FIG. 1, the device 100 also has an optical signal output port through which an incident beam is directed, and an optical signal input port 116 through which a reflected beam is received. Additional information regarding such hand-held spectrometer devices may be found in U.S. patent application Ser. No. 11/400,948, having the same assignee as the present application.

Figure 2:
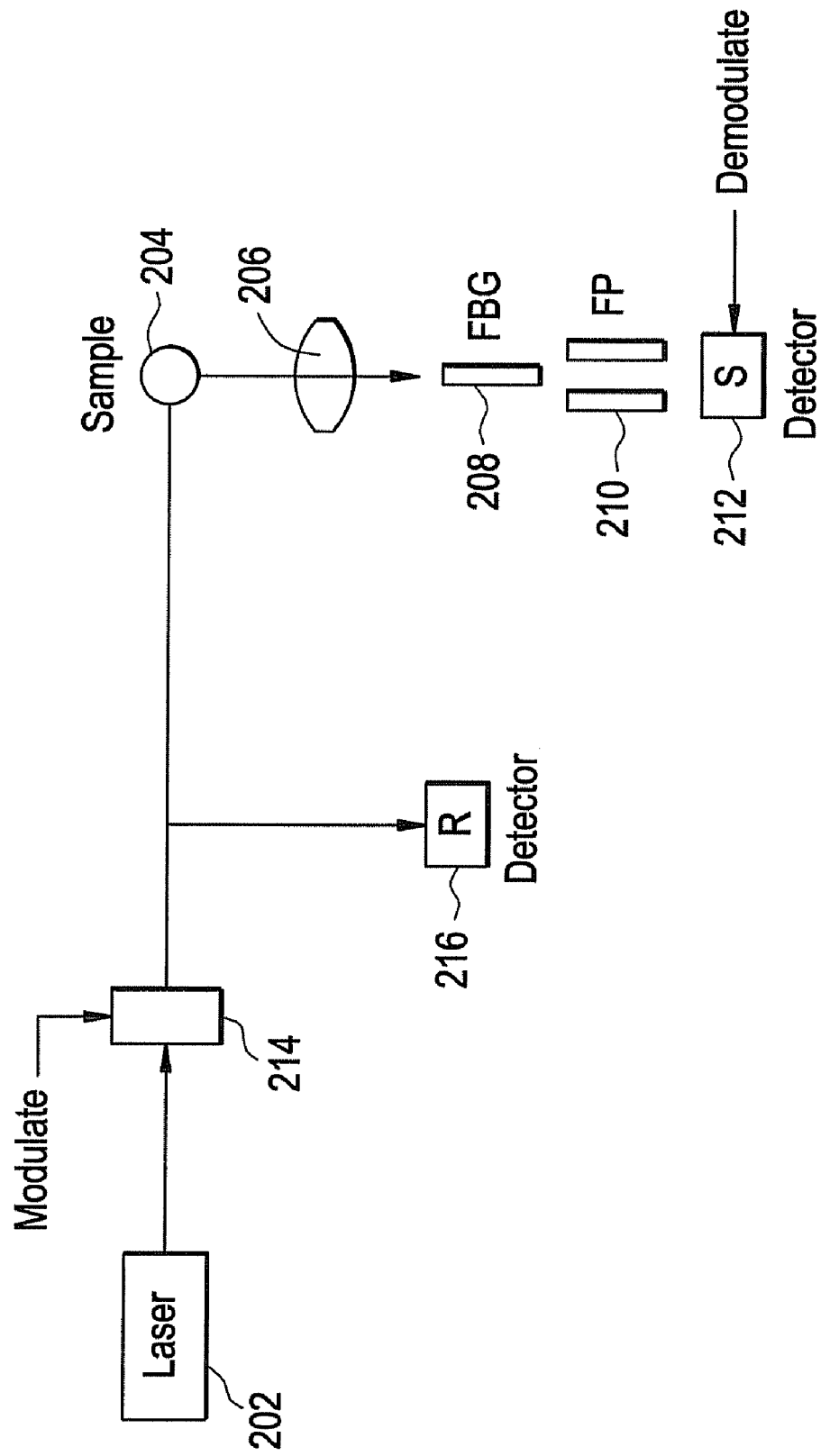
FIG. 2 is a schematic block diagram of a MEMS-based Raman signal detection system associated with the portable, hand-held Raman spectrometer device of FIG. 1.

FIG. 2 is a schematic block diagram of at least a portion of the optical components used in the exemplary MEMS based, Raman detection device shown in FIG. 1. An optical source 202 (e.g., laser) directs incident photons at sample 204, such as one contained in module 110 of FIG. 1, for example. In an exemplary embodiment, a scattered signal from the sample 204 is collected (e.g., at an angle of about 90 degrees with respect to the incident beam) through a micro lens 206 which is mounted on piezo-based mount (not shown), for example, so as to adjust the focal spot and to maximize the Raman signal and minimize the Rayleigh scattered light and transmitted laser light. The Raman scattered light collected by the high NA (numerical aperture) lens is coupled with the optical fiber in a Fiber Bragg grating (FBG) 208 having a transmission wavelength that may be fixed by the pitch of the FBG 208.

In addition, a tunable Fabry-Perot cavity 210 is provided for filtering the received Raman scattered photons at a selected wavelength, with the filtered Raman photons directed to a sample (S) detector 212. Also shown in FIG. 2 is a beam-interrupting mechanism 214 that chops (modulates) the intensity of the incident beam upon the sample 204, for purposes described in further detail hereinafter. In the case of heterodyne detection, the modulation frequency of the beam-interrupting mechanism is used to demodulate the signal detected by detector 212. A portion of the (modulated) input beam may be directed toward a reference (R) detector 216.

Figure 3:
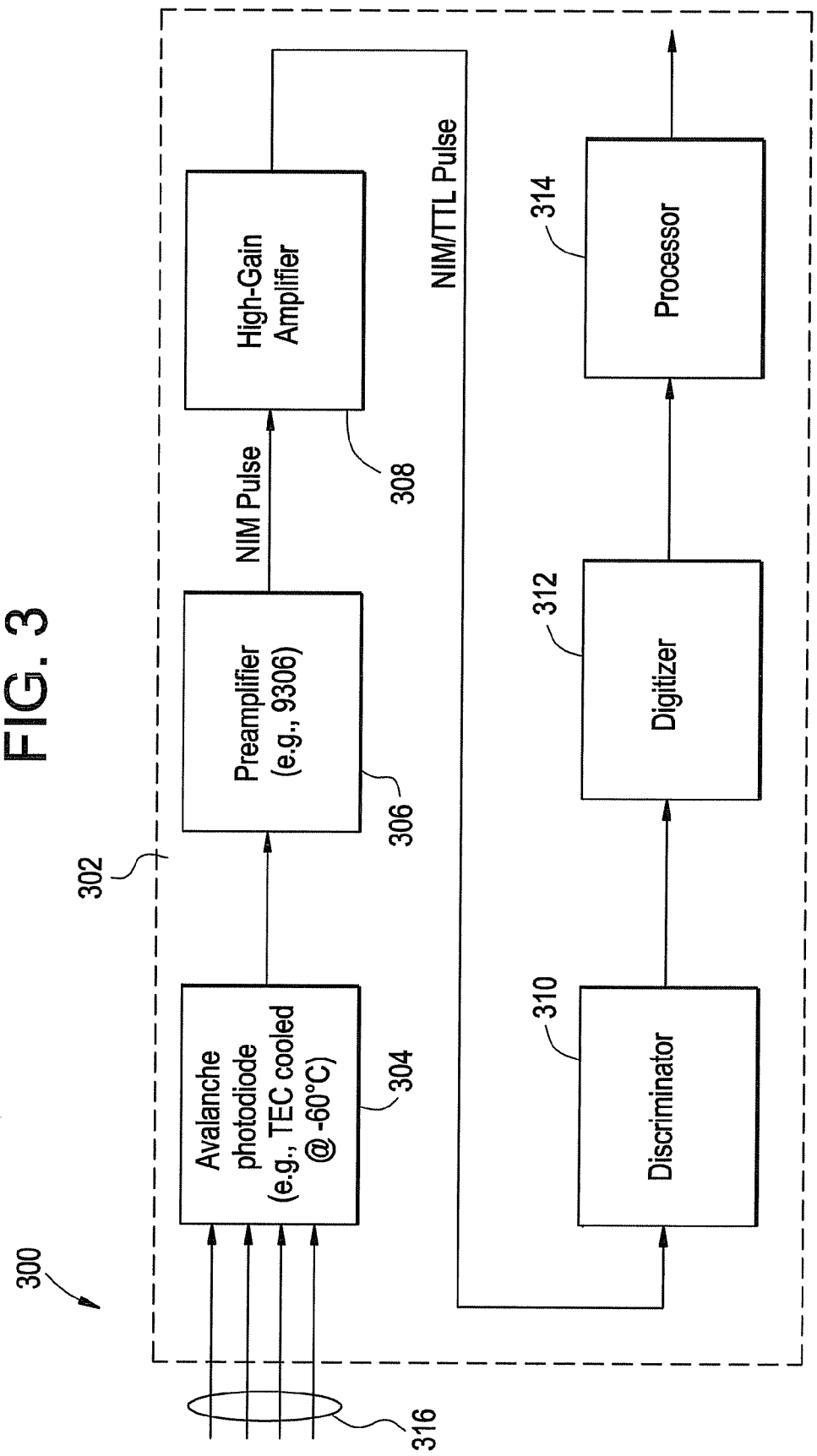
FIG. 3 is a block diagram illustrating a method for Raman detection though photon counting for improved signal-to-noise ratio, in accordance with an embodiment of the invention.

Referring now to FIG. 3, there is shown a schematic block diagram of a photon counting apparatus 300 and method for detecting a Raman scattered signal from a MEMS based spectrometer device, in accordance with an exemplary embodiment of the invention. As is shown, individual components of the photon counting apparatus 300 (which represents an exemplary embodiment of sample detector 212 in FIG. 2) are integrated on an individual microchip 302, which includes an avalanche photodiode (APD) 304, preamplifier 306, amplifier 308, discriminator 310, digitizer 312 and processor 314.

Raman scattered photons (arrows 316) from a sample (e.g., sample 204 in FIG. 2) are incident upon the APD 304, which is cooled (e.g., by thermoelectric cooling) to a temperature of about −60° C. and which is biased at a voltage slightly less than the APD's breakdown voltage (also known as the "sub-Geiger" mode of operation). Suitable examples of such an APD include, but are not limited to, model C 30645E from Perkin Elmer and model NDL 5553P from NEC Corporation. An output current pulse from the APD 304 is shaped by a preamplifier 306 (e.g., such as ORTEC model 9306, 1 GHz preamplifier) so as to create a NIM (Nuclear Instrumentation Methods) standard pulse. In turn, the NIM pulse is received by the high-gain amplifier 308 where it is converted from a current signal to a corresponding voltage signal.

The amplified voltage signal output from the high-gain amplifier 308 is coupled to the discriminator 310 so as to isolate single photon signals corresponding to the voltage pulses within the range setting (e.g., about 50 mV to about 1 V), with the analog output signal therefrom then converted to a digital signal by digitizer (A/D) converter 312. The individual photon counts are tracked/counted by the processor 314 and scaled as counts per second (cps) versus wavelength.

The minimum detectable power using the APD 304 depends upon the quantum efficiency of the APD 304 at a particular wavelength, the integration time, the dark current generation probability, the probability of detections against the discriminator setting, and the ionization coefficient (keff) of the APD. In particular, the higher the integration time and the lower the ionization coefficient, the lower the minimum detectable power. By way of example, with an integration time of about 10 milliseconds, an ionization coefficient of about 0.005 at a 1000 nm operating wavelength, the minimum detectable power is on the order of about 3 femto-watts, at least an order of magnitude less than conventional detection capabilities of portable devices.

The use of the APD in the sub-Geiger mode of operation provides certain advantages over the Geiger mode of operation (i.e., the APD biased above the breakdown voltage), in terms of the exemplary embodiments presented herein. First, the degree of APD gain is controlled in Sub-Geiger mode. In addition, there is no after-pulse effect that will limit the faster operation of the APD, unlike the Geiger mode. Furthermore, the heating of the APD, due to the avalanche process of ions, gives rise to a higher thermal noise in Geiger mode and, as such, reduces the SNR.

As a Raman scattered photon represents a very low intensity signal, the noise factor arising from APD dark current, amplifier noise and background noise are to be taken into account in order to attain a high SNR. Accordingly, the APD 304 is cooled to about −60° C. while the laser 202 is further modulated by the beam-interrupting mechanism 214. The sample detector 212 is further gated so as to be synchronized with the beam-interrupting mechanism 214 such that it only detects when the laser output is actually incident upon the sample 214. Because the amplified NIM pulse is passed through the discriminator 310 (FIG. 3), the amplifier noise, APD noise and dark noise can all be rejected, thereby improving SNR.

Moreover, for a highly fluorescent sample molecule (where Raman cannot be seen due to a very high intensity of fluorescence spectra), the present detection scheme is particularly useful as a fluorescence-event time scale is on the order of about a few microseconds to about a few milliseconds. Conversely, Raman scattering is instantaneous wherein the detection in this case is accomplished when the optical beam is actually incident on the sample. Thus, the detection process is also instantaneous such that only the Raman signal can be detected. Because the detector 212 may be gated, time resolved studies for short lived reactions or transient reactions may be carried out by changing the gated time of the detector.

Referring once again to FIG. 2, during portions of a duty cycle (e.g., 50%) the beam generated by the laser 202 is passed through the mechanism 214 and is incident upon the sample 204. As indicated above, both the Raman scattered signal and background light is collected through the collecting lens 206 and transmitted through the optical fiber and FBG 208 so that Rayleigh scattered light is filtered. Thus, only the Raman scattered light is transmitted through the FBG 208 and to the input of the tunable Fabry-Perot cavity 210.

On the other side of the Fabry-Perot cavity 210, the TEC-cooled APD 304 (FIG. 3) is coupled thereto through a high numerical aperture (NA) lens (not shown) with minimal loss. When the beam-interrupting mechanism 214 is modulating with 50% duty cycle, the laser output will be incident upon the sample 204 for the first portion of the cycle (e.g., 10 ms), and a first signal "A" will be detected by the APD 304. This first signal "A" contains both a Raman signal and a background signal. Conversely, when the laser is "chopped" (i.e., "off" during the second portion of the duty cycle), then only a background signal "B" is detected. The true Raman signal is therefore the difference between the first and second signals (i.e., A-B).

For embodiments where a beam-interrupting mechanism 214 is not implemented in conjunction with the photon counting method of Raman detection, background noise and noise from the amplifier 308 will be the primary obstacles in attaining higher SNR. Thus, the amplified signal from the APD is fed to the discriminator 310 where the lower level cutoff voltage thereof is set such that the short noise from the amplifier and the dark current from the APD will be cut off. Further, cosmic rays and very intense Rayleigh scattered signals are rejected through proper setting of the upper level cutoff voltage of the discriminator 310.

In accordance with another exemplary embodiment of the invention, a heterodyne technique for Raman signal detection is also disclosed for a hand-held Raman micro spectrometer, such as generally depicted by the beam-interrupting mechanism 214 shown in FIG. 2. In this regard, heterodyne signal detection includes modulating the input signal source (laser) 202 at a reference frequency (e.g., 15 kHz) and then extracting the reflected signal by demodulating the output at the reference frequency.

The present embodiments depict at least two approaches by which such modulation may be implemented: (1) through the use of an acousto-optic modulator (AOM) crystal, and (2) by mechanically chopping the source laser beam using a MEMS cantilever. The Raman signal received at the detector placed at the output of the tunable cavity would be demodulated at the reference frequency using a simple lock-in detection circuit. Accordingly, this results in significant signal-to-noise improvement given that Raman signals are typically very weak (e.g., a few pico watts) and also mitigates issues such as power management at the sample chamber/sample itself.

Because MEMS based IR/Raman spectrometers are not very common, the most prevalent technique to mitigate a power management problem is through the use of pulsed sources that are considerably expensive. Accordingly, as once again depicted in FIG. 2, light from the laser source 202 may chopped by the beam-interrupting mechanism 214, embodied for example using an acousto-optic modulator crystal or a scanning MEMS based cantilever at a frequency of a few kHz.

Figure 4:
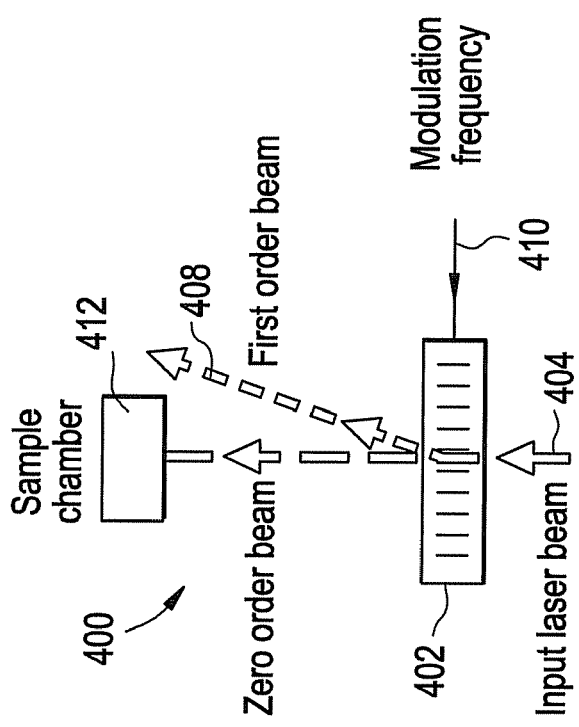
FIG. 4 is a schematic diagram illustrating one possible implementation of an acousto-optic modulator used for heterodyne Raman signal detection, in accordance with a further embodiment of the invention.

As more particularly illustrated in FIG. 4, an acousto-optic modulator (AOM) 400 includes an acousto-optic crystal 402 that acts as a diffraction grating when an acoustic wave (RF) is launched therein. The input laser beam 404 that passes though the crystal 402 is then diffracted, resulting in a changed wavelength, as well as spatial position for the higher-order diffracted beams with respect to the zero-order (spatially unshifted) beam. For a certain angle of incidence on the crystal and RF power, most of the laser power can be transferred from the zero order beam 406 (unshifted in frequency and position) to the first order-diffracted beam 408.

The AOM 400 can thus be used to switch on and off the laser beam 404 incident on the sample chamber 412 by triggering the RF drive frequency using a TTL pulse (corresponding to the modulation frequency) that will cause the laser power to be shifted from the zero order to first order beam at the frequency of the TTL pulse. Because only the zero-order beam 406 is caused to fall on the sample chamber 412, the AOM 400 acts as an efficient chopper for the input laser beam 404.

Figure 5:
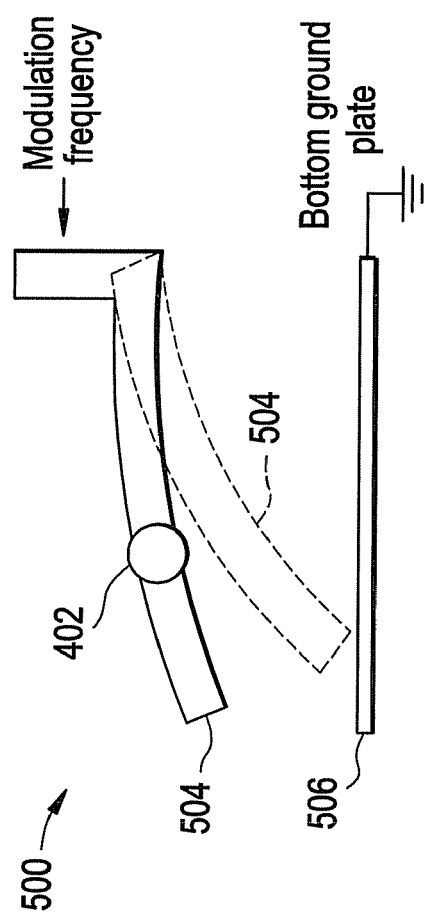
FIG. 5 is a schematic diagram of a MEMS cantilever configured for chopping an input optical beam for heterodyne Raman signal detection, in accordance with a further embodiment of the invention.

Another approach for achieving chopping is through a MEMS cantilever apparatus 500 that is mechanically scanned across a laser beam 502 by electrostatic actuation, as shown in FIG. 5. A voltage at the modulation frequency is applied to a cantilever beam 504 with respect to a bottom ground plate 506, wherein the changing electrostatic force between the cantilever 504 and the plate 506 causes the cantilever 504 to vibrate across the path of the laser beam 502, which is incident on the sample holder. As can be seen, the cantilever is initially positioned so as to block the path of the laser beam 502 when no voltage is applied thereto. Then, when a voltage is applied across the cantilever 504 and ground plate 506, the resulting attraction therebetween causes cantilever 504 to deflect toward the ground plate 506, moving the cantilever 504 out of the path of beam 502. When the voltage is removed, the cantilever 504 then return to its initial position to block the beam 502. It will also be appreciated that the cantilever apparatus 500 could also be configured to operate in reverse; i.e., applying a voltage causes the cantilever to deflect into the path of the beam 502 instead of out of the path of the beam.

Regardless of how the laser beam is chopped (using, for example, either of the two aforementioned techniques), it interacts with the sample and the Raman signal is frequency filtered in the tunable Fabry Perot filter, and the resulting intensity variation is detected by a photodetector. The output of the photodetector (e.g., detector 212 in FIG. 2) is then demodulated at the reference frequency (of chopping) using a lock-in detection circuit (not shown), and the Raman spectrum for the sample concerned is thus obtained. In still a further embodiment, the heterodyne technique (using an AOM or MEMS cantilever as a chopping mechanism) may be used in combination with the above described photon counting method.

As will thus be appreciated, the above described photo counting and/or heterodyne detection techniques address several problems associated with integrated, hand-held Raman micro spectrometer devices, including for example, power management on surface of sample chamber. Since Raman processes are very weak, the samples need to be irradiated with considerably high laser power, resulting in an intensity of at least about 650 kW/cm$^2$ (for a 50 mW beam focused to a 100 μm diameter spot) at the wall of the sample chamber. This may cause serious damage to the walls of the sample chamber, as well as to liquid or solid samples due to burning/melting/boiling. The proposed embodiments would mitigate this risk, since by chopping the laser beam using an acousto-optic modulator or a mechanical chopper, the sample chamber is protected from continuous exposure to the laser radiation, thereby reducing heating up of the chamber and sample significantly.

Moreover, the embodiments of the invention also represent a low cost solution for power management, as they obviate the need for an expensive pulsed laser source, which is typically the most common solution to prevent unwarranted heating of the sample chamber walls and/or sample itself. The scanning cantilever switch of FIG. 5 is also a low cost MEMS solution for effectively modulating the source laser beam. As also stated above, since Raman signals are extremely weak (e.g., about 100 pW at most), SNR is always an issue, especially for trace sample detection. Heterodyne detection can thus be used to improve SNR by more than a factor of 100. Further, since a Raman micro spectrometer is be a portable instrument to be operated in the field, stray ambient light is a big problem, particularly considering the fact that Raman signals are very weak. Heterodyne detection is therefore very useful for extracting extremely low signal levels from large background noise, since the detection is carried out specifically at the reference modulation frequency.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof Therefore, it is intended that the invention not be limited to the particular embodiment disclosed as the best mode contemplated for carrying out this invention, but that the invention will include all embodiments falling within the scope of the appended claims.

The invention claimed is:

1. A method of Raman detection, comprising:

directing an input optical beam incident upon a sample to be measured that is contained within a portable, integrated spectrometer instrument, said input optical beam being modulated at a heterodyne frequency;

directing scattered photons by said sample through receiving optics so as to filter Rayleigh scattered photons and pass Raman scattered photons through a tunable filter, said receiving optics and said tunable filter being contained within the portable, integrated spectrometer instrument; and detecting said passed Raman scattered photons at a wavelength passed by said tunable filter through demodulation at said heterodyne frequency, wherein said passed Raman scattered photons are detected using photon counting using an avalanche photodiode (APD) operating in a sub-Geiger mode.

2. The method of claim 1, further comprising modulating said input optical beam with an acousto-optic modulator.

3. The method of claim 1, further comprising modulating said input optical beam with a deflectable, micro electromechanical system (MEMS) cantilever positioned within the path of said input optical beam.

4. The method of claim 3, wherein an applied voltage across said cantilever and a ground plate causes said cantilever to deflect out of the path of said input optical beam.

5. An apparatus for Raman, comprising:

a portable, integrated spectrometer instrument, comprising:

an optical source for directing an input optical beam incident upon a sample to be measured;

a beam-interrupting mechanism configured to modulate said input optical beam at a heterodyne frequency;

receiving optics configured to collect photons scattered by said sample so as to filter Rayleigh scattered photons and pass Raman scattered photons though a tunable filter; and a photon detector configured to detect said passed Raman scattered photons at a wavelength passed by said tunable filter though demodulation at said heterodyne frequency, wherein said passed Raman scattered photons are detected using photon counting, implemented using an avalanche photodiode (APD) operating in sub-Geiger mode.

6. The apparatus of claim 5, wherein said beam-interrupting mechanism further comprises an acousto-optic modulator.

7. The apparatus of claim 5, wherein said beam-interrupting mechanism further comprises a deflectable, micro electromechanical system (MEMS) cantilever positioned within the path of said input optical beam.

8. The apparatus of claim 7, wherein an applied voltage across said cantilever and a ground plate causes said cantilever to deflect out of the path of said input optical beam.

* * * * *

UNITED STATES PATENT AND TRADEMARK OFFICE
CERTIFICATE OF CORRECTION

PATENT NO. : 7,586,602 B2
APPLICATION NO. : 11/459449
DATED : September 8, 2009
INVENTOR(S) : Maity et al.

It is certified that error appears in the above-identified patent and that said Letters Patent is hereby corrected as shown below:

In Fig. 5, Sheet 4 of 4, delete Tag "402" and insert Tag -- 502 --, therefor.

In Column 7, Line 47, delete "thereof" and insert -- thereof. --, therefor.

In Column 8, Line 35, in Claim 5, delete "though" and insert -- through --, therefor.

In Column 8, Line 39, in Claim 5, delete "though" and insert -- through --, therefor.

Signed and Sealed this

Twenty-third Day of March, 2010

David J. Kappos
*Director of the United States Patent and Trademark Office*